(12) United States Patent
Park et al.

(10) Patent No.: US 11,700,324 B2
(45) Date of Patent: Jul. 11, 2023

(54) ELECTRONIC DEVICE HAVING CONNECTION PATH BETWEEN BUCK CONVERTERS

(71) Applicant: Samsung Electronics Co., Ltd., Gyeonggi-do (KR)

(72) Inventors: Junghoon Park, Gyeonggi-do (KR); Hyunseok Kim, Gyeonggi-do (KR); Hoyeong Lim, Gyeonggi-do (KR); Seunggoo Kang, Gyeonggi-do (KR); Moonki Yeo, Gyeonggi-do (KR); Seungbo Shim, Gyeonggi-do (KR); Yongseung Yi, Gyeonggi-do (KR); Dongil Son, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 337 days.

(21) Appl. No.: 17/074,760

(22) Filed: Oct. 20, 2020

(65) Prior Publication Data

US 2021/0126994 A1 Apr. 29, 2021

(30) Foreign Application Priority Data

Oct. 23, 2019 (KR) ........................ 10-2019-0132139

(51) Int. Cl.
*H04M 1/02* (2006.01)
*H02M 3/158* (2006.01)
(Continued)

(52) U.S. Cl.
CPC ........ *H04M 1/0277* (2013.01); *G06F 1/3203* (2013.01); *H01M 10/425* (2013.01);
(Continued)

(58) Field of Classification Search
CPC ............ H04M 1/0277; H04M 1/0262; H04M 1/0274; G06F 1/3203
(Continued)

(56) References Cited

U.S. PATENT DOCUMENTS 10,126,791 B2   11/2018  Beeston et al.
2007/0001653 A1  1/2007  Xu
(Continued)

FOREIGN PATENT DOCUMENTS

CN     202034804 U  * 11/2011
JP     2007-244046 A   9/2007
(Continued)

OTHER PUBLICATIONS

International Search Report dated Feb. 2, 2021.

*Primary Examiner* — Andargie M Aychillhum
(74) *Attorney, Agent, or Firm* — Cha & Reiter, LLC

(57) ABSTRACT

According to an embodiment disclosed in the specification, an electronic device comprises a battery disposed inside the electronic device; a printed circuit board (PCB) disposed inside the electronic device; at least one electronic component disposed on the PCB; and a first buck converter having a first end and a second end, wherein the first end is routed to the battery; and a second buck converter having a first end and a second end, wherein the first end is selectively electrically connected to the second end of the first buck converter, and the second end is routed to the at least one electronic component, and wherein the first buck converter and the second buck converter are configured to boost a voltage provided from the battery through an electrical path formed from the battery by the first end of the first buck converter, and the second end of the first buck converter, the (Continued)

first end of the second buck converter and the second end of the second buck converter to the at least one electronic component.

17 Claims, 6 Drawing Sheets

(51) Int. Cl.
    *G06F 1/3203*     (2019.01)
    *H05K 3/30*     (2006.01)
    *H01M 10/42*     (2006.01)
    *H02M 1/00*     (2006.01)

(52) U.S. Cl.
    CPC ......... *H02M 3/158* (2013.01); *H04M 1/0262* (2013.01); *H04M 1/0274* (2013.01); *H05K 3/303* (2013.01); *H02M 1/007* (2021.05)

(58) Field of Classification Search
    USPC .......................................................... 361/764
    See application file for complete search history.

(56) References Cited

U.S. PATENT DOCUMENTS

2018/0348833 A1*   12/2018   Beeston .................... G06F 1/26
2019/0028018 A1     1/2019   Datta et al.
2020/0044458 A1     2/2020   Yoon et al.

FOREIGN PATENT DOCUMENTS

| KR | 10-2018-0038856 A | | 4/2018 |
| KR | 20180038856 A | * | 4/2018 |
| KR | 10-2018-0085549 A | | 7/2018 |
| WO | 2016/073645 A1 | | 5/2016 |

* cited by examiner

US 11,700,324 B2

ELECTRONIC DEVICE HAVING CONNECTION PATH BETWEEN BUCK CONVERTERS

CROSS-REFERENCE TO RELATED APPLICATION(S)

This application is based on and claims priority under 35 U.S.C. § 119 to Korean Patent Application No. 10-2019-0132139, filed on Oct. 23, 2019, in the Korean Intellectual Property Office, the disclosure of which is incorporated by reference herein its entirety.

BACKGROUND

1. Field

The disclosure relates to a technology for reducing a mounting area of a power management integrated circuit (PMIC).

2. Description of Related Art

Electronic devices, such as a smartphone, a wearable device, are often equipped with a battery to allow mobility. Such the electronic device may perform various functions, using power stored in the battery. For example, the electronic device may drive a display using power stored in a battery or may capture an image through a camera module.

The above information is presented as background information only to assist with an understanding of the disclosure. No determination has been made, and no assertion is made, as to whether any of the above might be applicable as prior art with regard to the disclosure.

SUMMARY

In accordance with an aspect of the disclosure, an electronic device comprises a battery disposed inside the electronic device; a printed circuit board (PCB) disposed inside the electronic device; at least one electronic component disposed on the PCB; and a first buck converter having a first end and a second end, wherein the first end is routed to the battery; and a second buck converter having a first end and a second end, wherein the first end is selectively electrically connected to the second end of the first buck converter, and the second end is routed to the at least one electronic component, and wherein the first buck converter and the second buck converter are configured to boost a voltage provided from the battery through an electrical path formed from the battery by the first end of the first buck converter, and the second end of the first buck converter, the first end of the second buck converter and the second end of the second buck converter to the at least one electronic component.

In accordance with another aspect of the disclosure, an electronic device comprises: a battery disposed inside the electronic device; a PCB disposed inside the electronic device; at least one electronic component disposed on the PCB; and an PMIC routed to the battery and the at least one part, wherein the PMIC comprises: a first buck converter, having a first end and a second end, wherein the first end is routed to the battery and the second end is routed to a first switch; and a second buck converter, having a first end and a second end, wherein the first end is routed to the first switch and the second end is routed to the at least one electronic component, and wherein, when the electronic device satisfies a first condition, the PMIC is configured to: short the first switch; and boost a voltage applied from the battery through an electrical path formed through the battery, the first buck converter, the first switch, and the second buck converter to apply the boosted voltage to the at least one electronic component.

Other aspects, advantages, and salient features of the disclosure will become apparent to those skilled in the art from the following detailed description, which, taken in conjunction with the annexed drawings, discloses certain embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

An electronic device may include a PMIC to properly distribute the power stored in a battery to various parts (e.g., a display or a camera module). The PMIC may properly distribute and convert the power received from the battery and may transmit the power to the various parts.

The PMIC may include a plurality of buck converters for reducing a voltage. The plurality of buck converters may be routed to the battery and the various parts through a power rail. However, the power rail may be changed at each specific cycle or each type of the electronic product equipped with the PMIC. When the power rail is changed, some of the plurality of buck converters might not be used. The unused buck converters result in unnecessary costs and occupy a mounting area.

Certain aspects of the disclosure may address at least the above-mentioned problems and/or disadvantages and to may provide at least the advantages described below.

In certain embodiments, buck converters can be configured to operate a buck boosters, thereby increasing utilization of the buck booster and alleviate the need for separate buck boosters.

Figure 1:
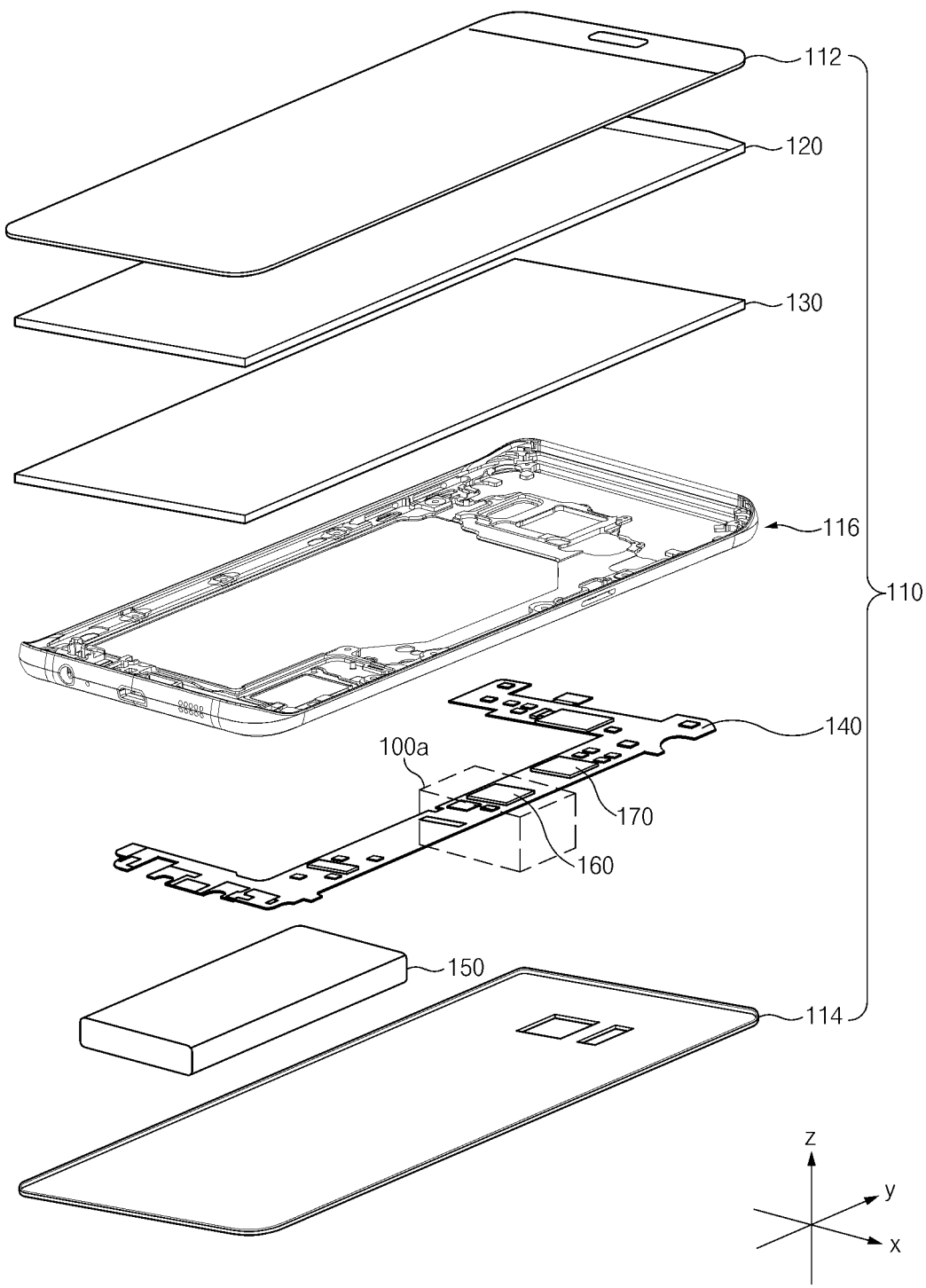
FIG. 1 is an exploded perspective view of an electronic device according to an embodiment.

FIG. 1 is an exploded perspective view of an electronic device according to an embodiment.

Referring to FIG. 1, an electronic device 100 may include housing 110, a display 120, a shielding layer 130, a printed circuit board (PCB) 140, a battery 150, a PMIC 160, and a processor 170. According to an embodiment, the electronic device 100 may be implemented without some of the elements illustrated in FIG. 1 or may be implemented to further include additional elements. According to certain embodiments, the electronic device 100 may further include at least part of configurations of the electronic device 601 of FIG. 6. Additionally, in different embodiments, the order in which the components included in the electronic device 100 are stacked may be different from the stacked order illustrated in FIG. 1.

The housing 110 may form an outer appearance of the electronic device 100. For example, the housing 110 may include a cover glass 112, a back cover 114 facing away from the cover glass 112, and a side member 116 surrounding a space between the cover glass 112 and the back cover 114.

The cover glass 112 may transmit light generated by the display 120. Furthermore, a user may touch the cover glass 112 by using a portion (e.g., a finger) of his/her body to perform a touch, or use an electronic pen. For example, the cover glass 112 may be formed of tempered glass, reinforced plastics, or a flexible polymer material. According to an embodiment, the cover glass 112 may be also referred to as a "glass window", even if it is not made of nor comprises glass.

The back cover 114 may be coupled with a back surface of the electronic device 100 (i.e., disposed under the side member 116). The back cover 114 may be formed of tempered glass, plastic, and/or metal. According to an embodiment, the back cover 114 may be integrally implemented with the side member 116 or may be implemented to be removable by the user.

The side member 116 may protect the components included in the electronic device 100. For example, the display 120, the PCB 140, the battery 150, and the like may be accommodated within the side member 116, and the side member 116 may protect the components from an external impact.

The side member 116 may include an area that is not exposed to the outside of the electronic device 100 and an area that is exposed to the outside of the electronic device 100. For example, the area not exposed to the outside of the electronic device 100 may be formed of a non-conductive material. The area exposed to the outside of the electronic device 100 may be formed of metal. The exposed area formed of metal may be also referred to as a "metal bezel". According to an embodiment, at least part of the metal bezel may be used as an antenna element for transmitting and receiving a signal of a specified frequency band.

The display 120 may be disposed under the cover glass 112. The display 120 may be electrically connected to the PCB 140 to output content (e.g., a text, an image, a video, an icon, a widget, a symbol, or the like) or to receive a touch input (e.g., a touch, a gesture, a hovering, or the like) from the user.

The shielding layer 130 may be interposed between the display 120 and the side member 116. The shielding layer 130 may shield electromagnetic waves generated between the display 120 and the PCB 140 to prevent electro-magnetic interference between the display 120 and the PCB 140.

According to an embodiment, the shielding layer 130 may include a thin film sheet or a plate, which is formed of copper (Cu) or graphite. In the case where the shielding layer 130 is formed of copper (Cu) or graphite, the components included in the electronic device 100 may be grounded to the shielding layer 130.

The PCB 140 may mount at least one electronic component (e.g., the processor 170, the PMIC 160, a memory, a USB port, a camera module, a proximity sensor, an illuminance sensor, a fingerprint sensor, a communication processor, or the like). In the specification, the PCB 140 may be referred to as a "main board" or a "printed board assembly (PBA)".

The battery 150 may convert chemical energy and electrical energy, and vice versa. For example, when the electronic device 100 is in general use by user and not connected to an external power source, the battery 150 converts stored chemical energy to electrical energy. When the user is charging the battery from an external power supply, the battery converts electrical energy to chemical energy. According to an embodiment, the PMIC 160 for managing charging and discharging of the battery 150 may be included on the PCB 140.

The PMIC 160 may be disposed on the PCB 140. The PMIC 160 may be an integrated circuit or a chip. The PMIC 160 may be included in the power management module 688. The PMIC 160 may be routed to the battery 150 and at least one electronic component. The PMIC 160 may change the voltage applied from the battery 150 to apply the changed voltage to at least one electronic component; alternatively, the PMIC 160 may change a voltage applied from at least one electronic component to charge the battery 150 in a contrary manner.

The processor 170 may be connected to the PMIC 160 on the PCB 140. According to certain embodiments, the PMIC 160 may supply power to at least one electronic component or may charge the battery 150, under the control of the processor 170, or independently.

The PMIC may include a plurality of buck converters for reducing a voltage. The plurality of buck converters may be routed to the battery and various parts through a power rail. However, the power rail may be changed at each specific cycle or each type of the electronic product equipped with the PMIC. When the power rail is changed, the PMIC avoids the occurrence where some of plurality of buck converters are not be used.

However, some of the buck converters of the PMIC 160 according to an embodiment of the disclosure may be routed on the PCB 140. The routed buck converters may operate as a buck booster that boosts the voltage applied from the power source (e.g., the battery 150). Accordingly, a space for mounting a buck booster is reduced in the PMIC 160.

In the specification, the description given with reference to FIG. 1 may be identically applied to components having the same reference numerals/marks as the components of the electronic device 100 described with reference to FIG. 1.

Figure 2:
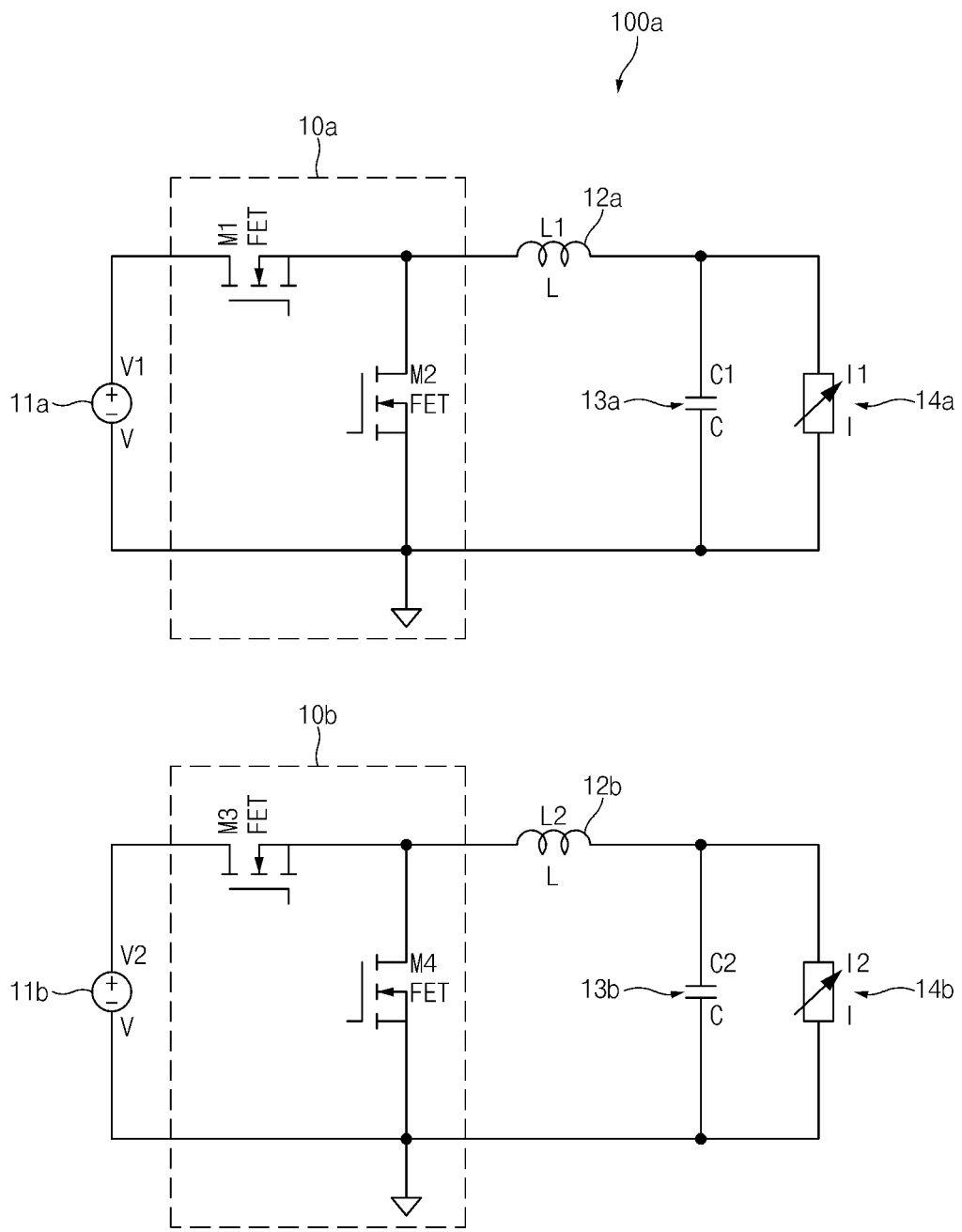
FIG. 2 illustrates buck converters according to an embodiment.

FIG. 2 illustrates buck converters according to an embodiment. FIG. 2 is an enlarged view of an area 100*a* in which the PMIC 160 (e.g., the power management module 688 of FIG. 6) is disposed, in the PCB 140 shown in FIG. 1; buck converters 10*a* and 10*b* illustrated in FIG. 2 may be included in the PMIC 160.

Referring to FIG. 2, the plurality of buck converters 10*a* and 10*b* may be disposed on the PCB 140. The plurality of buck converters 10*a* and 10*b* may be routed to power source 11*a* and 11*b* and at least one electronic component 14*a*, 14*b* on the PCB 140, respectively. According to an embodiment, the electronic component 14*a* and/or electronic component 14*b* may operate as a load. For example, one end of the buck converter a 10*a* may be routed to the power source a 11*a* (e.g., the battery 150) and the other end of the buck converter a 10*a* may be routed to the electronic component 14*a*. An inductive element a 12*a* and a capacitive element a 13*a* may be disposed between the other end of the buck converter a 10*a* and the part a 14*a*. For another example, one end of the buck converter b 10*b* may be routed to the power source b 11*b* (e.g., the battery 150), and the other end of the buck converter b 10*b* may be routed to the electronic component 14*b*. An inductive element b 12*b* and the capacitive element b 13b may be disposed between the other end of the buck converter b 10b and the part b 14b.

According to an embodiment, the plurality of buck converters 10a and 10b may reduce the voltage applied from the power sources 11a and 11b and may apply the reduced voltage to the electronic component 14a and 14b. For example, the buck converter a 10a may change a voltage to a proper voltage required by the electronic component 14a by reducing the voltage applied from the power source a 11a. When the proper voltage is to be applied, the electronic component 14a may operate. For another example, the buck converter b 10b may change a voltage to a proper voltage required by the electronic component 14b by reducing the voltage applied from the power source b 11b. When the proper voltage is to be applied, the electronic component 14b may operate.

According to an embodiment, the buck converters 10a and 10b may include different types of transistors, respectively. For example, the buck converters 10a and 10b may include a P-type transistor and an N-type transistor; the P-type transistor and N-type transistor may be connected in parallel. According to certain embodiments, the transistor may be a metal oxide semiconductor field effect transistor (MOSFET) or a filed effect transistor (FET).

The embodiment illustrated in FIG. 2 is shown by way of example, and certain embodiments disclosed in the specification are not limited to the illustration of FIG. 2.

According to certain embodiments, a first end of the buck converter 10a and a second end of the second buck converter 10b can have selectively establishable electrical connection which can be controllable by switches. When the electrical connection is established, the first buck converter 10a and the second buck converter 10b operate a buck boosters to provide voltage to electrical component 14b.

Figure 3:
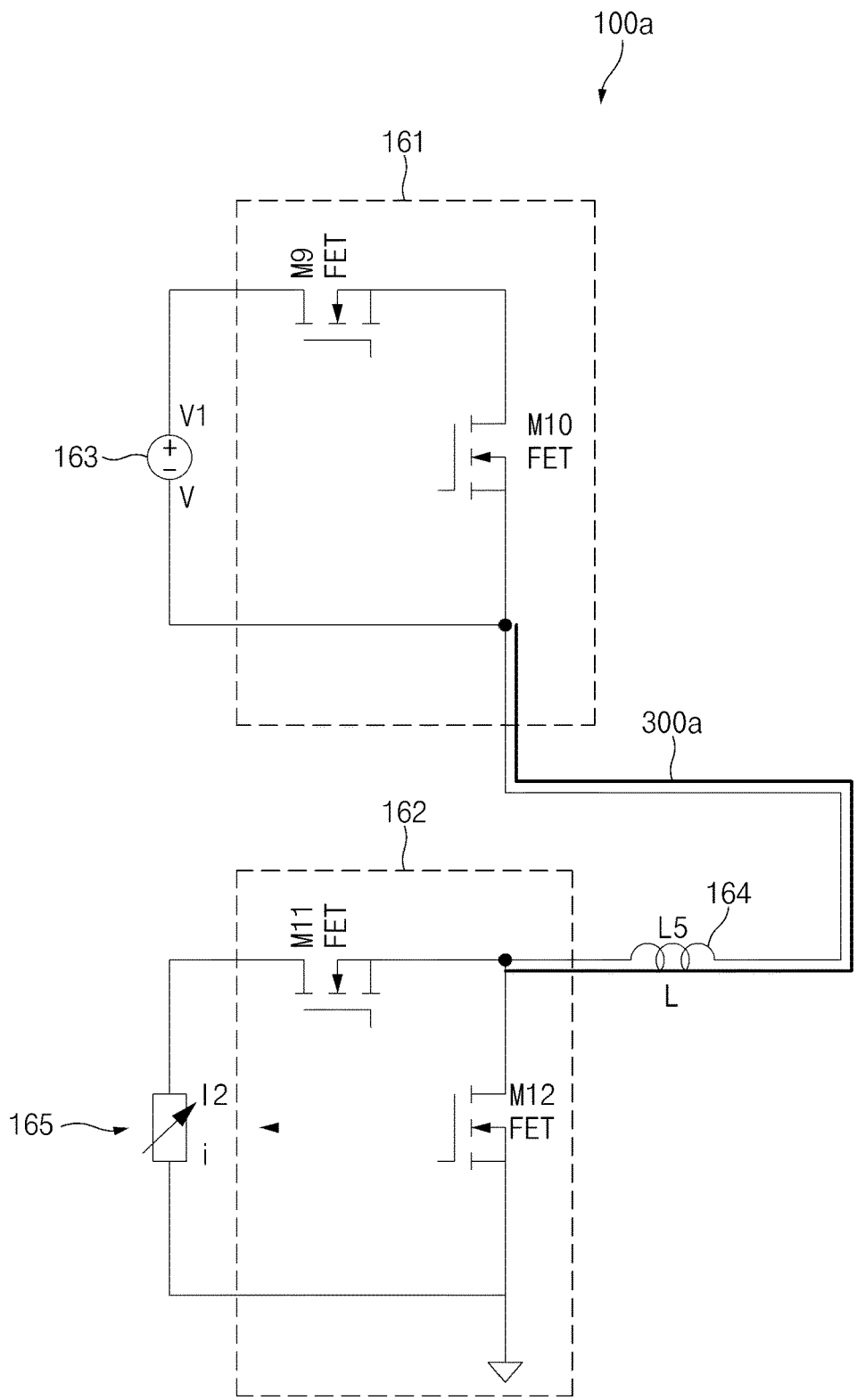
FIG. 3 illustrates buck converters according to another embodiment.

FIG. 3 illustrates buck converters according to another embodiment. FIG. 3 is an enlarged view of the area 100a in which the PMIC 160 is disposed, in the PCB 140 shown in FIG. 1. Buck converters 161 and 162 illustrated in FIG. 3 may be included in the PMIC 160 and may be different from the buck converters 10a and 10b illustrated in FIG. 2. According to an embodiment, the electronic device 100 (e.g., the PMIC 160) may change a circuit including the buck converters 10a and 10b illustrated in FIG. 2 to a circuit including converters 161 and 162 illustrated in FIG. 3 by changing the routing of the PCB 140. For example, as illustrated in FIG. 3, the electronic device 100 (e.g., the PMIC 160) may change two buck converters (e.g., the buck converters 10a and 10b of FIG. 2) into a buck booster including the buck converters 161 and 162 by changing the routing of the PCB 140. In certain embodiments, the routing of the PCB can be changed by selective establishment of an electrical path 300a (selectively electrically connected) between the first buck converter 161 and the second buck converter 163. The electrical path 300a can be selectively established by means of switches that, when shorted, establish the electrical path 300a, thus changing the routing of the PCB 140.

Referring to FIG. 3, the buck converters 161 and 162 may be routed to each other (such as by a switch that establishes a short circuit, which may include an inductor) on the PCB 140. For example, a first end of the first buck converter 161 may be routed to a power source 163 and the second end of the first buck converter 161 may be routed to a first end of the second end of the second buck converter 162. The second end of the second buck converter 162 may be routed to a first electronic component 165. In certain embodiments, a "first end" or "second end" can be a terminal.

An inductive element 164 may be disposed on a path through which the first buck converter 161 and the second buck converter 162 are routed to each other. According to an embodiment, the first electronic component 165 may operate as a load. For example, the first electronic component 165 may include an arbitrary element, part, or circuit.

According to an embodiment, the PMIC 160 (e.g., the power management module 688 of FIG. 6) may apply a proper voltage to the first electronic component 165, using the first buck converter 161 and the second buck converter 162. For example, because the first buck converter 161 and the second buck converter 162 are routed on the PCB 140, a first electrical path 300a may be formed through the power source 163, the first buck converter 161, and the second buck converter 162. For example, the PMIC 160 may apply a proper voltage to the first electronic component 165 through the first electrical path 300a, and then the first electronic component 165 may operate.

The PMIC 160 according to an embodiment of the disclosure may include the first buck converter 161 and the second buck converter 162 that are routed on the PCB 140. When the power rail is changed, the routed first buck converter 161 and second buck converter 162 may operate as a buck booster that boosts the voltage applied from a power source (e.g., the battery 150). Accordingly, a a separate buck booster may be unnecessary, thereby saving PCB space and reducing costs.

Figure 4:
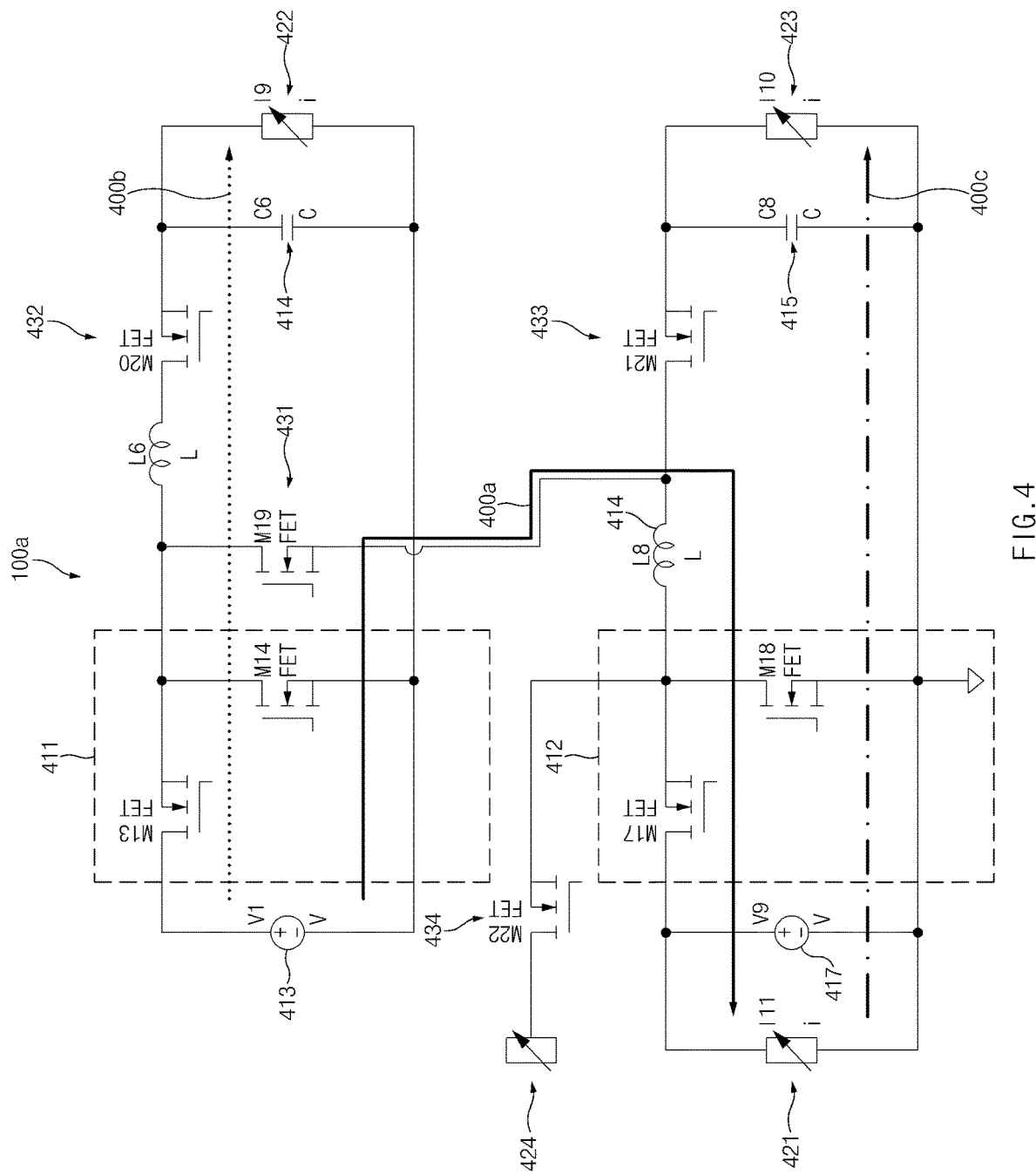
FIG. 4 illustrates buck converters according to still another embodiment.

FIG. 4 illustrates buck converters according to still another embodiment. FIG. 4 is an enlarged view of the area 100a in which the PMIC 160 (e.g., the power management module 688 of FIG. 6) is disposed, in the PCB 140 shown in FIG. 1. Buck converters 411 and 412 illustrated in FIG. 4 may be included in the PMIC 160 and may be different from the buck converters 10a, 10b, 161, and 162 illustrated in FIGS. 1 to 3.

Referring to FIG. 4, the buck converters 411 and 412 may be routed to each other on the PCB 140 (for example, by an electrical path that is established by shorting switches). For example, a first end of the first buck converter 411 may be routed to a first power source 413, and the second end of the first buck converter 411 may be directly connected to a first switch 431. The first end of the second buck converter 412 may be electrically connected to the first switch 431 and the second end of the second buck converter 412 may be routed to a second power source 417 and/or a first electronic component 421. According to an embodiment, the first electronic component 421 may operate as a load. For example, the first electronic component 421 may include an arbitrary element, part, or circuit. A first inductive element 414 may be disposed on a path through which the first switch 431 and the second buck converter 412 are routed.

The second end of the first buck converter 411 may be routed to a second switch 432; the second switch 432 may be routed to a second electronic component 422. According to an embodiment, the second electronic component 422 may operate as a load. For example, the second electronic component 422 may include an arbitrary element, part, or circuit. Also, first end of the second buck converter 412 may be routed to a third switch 433; the third switch 433 may be routed to a third electronic component 423. For example, in a fourth switch 434, first end may be routed to the second buck converter 412 and the other end may be routed to a fourth part 424. According to an embodiment, the third part 423 may operate as a load. For example, the third part 423 may include an arbitrary element, part, or circuit.

The term "electrical connection" "electrically connected" or "routed" shall be understood to include a low impedance, such as the resistance across a biased transistor or diode, between the electrically connected devices, such that the voltage across at one end of the electrical connection is functionally the same as the voltage of the other end of the electrical connection. Not electrically connected or not routed can include a high electrical impedance between two devices, such that the two devices operate independently. "Selectively electrically connected" shall be understood to means conditionally electrically connectable, such as by a switch.

According to an embodiment, when the electronic device 100 satisfies a first condition, the PMIC 160 may apply a proper voltage to the first electronic component 421, using the first buck converter 411 and the second buck converter 412. For example, because the first buck converter 411 and the second buck converter 412 are routed on the PCB 140 when the first switch 431 is shorted, a first electrical path 400*a* may be formed through the power source 413, the first buck converter 411, the first switch 431, and the second buck converter 412. For example, the PMIC 160 may apply a proper voltage to the first part 421 through the first electrical path 400*a*, and then the first part 421 may operate. In this case, because the second switch 432 and the third switch 433 are opened, the first buck converter 411 and the second electronic component 422 may be separated from each other, and the second buck converter 412, and the third electronic component 423 may be separated from each other.

In certain embodiments, the PMIC 160, or another processor(s) may control the switches 431, 432, 433.

According to an embodiment, when the electronic device 100 satisfies a second condition, the PMIC 160 may apply a proper voltage to the second electronic component 422 and the third electronic component 423, using the first buck converter 411 and the second buck converter 412. For example, when the first switch 431 is opened and the second switch 432 and the third switch 433 are shorted, the first buck converter 411 and the second electrical component 422 may be routed on the PCB 140, and the second buck converter 412 and the third electrical component 423 may be routed on the PCB 140. Accordingly, both a second electrical path 400*b* and a third electrical path 400*c* may be formed. In this case, because the first switch 431 is opened, the first buck converter 411 and the second buck converter 412 may not be routed. The PMIC 160 may apply a proper voltage to the second electrical component 422 and the third electrical component 423 through the second electrical path 400*b* and the third electrical path 400*c*, and the second electrical component 422 and the third electrical component 423 may operate.

According to an embodiment, the PMIC 160 may use the circuit of FIG. 4 as two buck converters (the first buck converter 411 and the second buck converter 412) by opening the first switch 431 and the fourth switch 434 and shorting the second switch 432 and the third switch 433. For example, the first buck converter 411 may convert the voltage supplied from the first power source 413 to apply a proper voltage to the second electrical component 422; the second buck converter 412 may convert the voltage supplied from the second power source 417 to apply a proper voltage to the third electrical component 423.

According to an embodiment, the PMIC 160 may use the circuit of FIG. 4 as a buck booster by shorting the first switch 431 and the fourth switch 434 and opening the second switch 432 and the third switch 433. For example, the buck booster may boost the voltage supplied from the first power source 413 to apply the boosted voltage to the fourth load 424 routed to the fourth switch 434.

The PMIC 160 according to an embodiment of the disclosure may change a path through which the first buck converter 411 and the second buck converter 412 are routed to other electrical components. The changed path allows the first buck converter 411 and the second buck converter 412 to operate as a buck booster or buck regulator. Accordingly, a space for mounting a buck booster may be unnecessary or reduced in the PMIC 160 according to an embodiment of the disclosure, and a production cost of the PMIC 160 may be reduced.

For example, the electronic device 100 (e.g., the electronic device 601 of FIG. 6) may selectively use cameras (e.g., a front camera and a time of flight (TOF) camera) (e.g., a camera module 680 of FIG. 6) included in the electronic device 100. For example, when a front camera is used, the PMIC 160 may use at least one of the first buck converter 411 and the second buck converter 412 to supply a power source to the front camera. For example, when the front camera is not used (i.e., when another camera (e.g., TOF camera) is used), the PMIC 160 may be used as a buck booster supplying a power source to another camera by changing a path through which the first buck converter 411 and the second buck converter 412 are routed to other electrical components. For another example, an electronic device may use different power sources for wireless charging or wire charging. For example, during wireless charging, the electronic device may supply a power source using at least one of the first buck converter 411 and the second buck converter 412; during wired charging, the electronic device may be used as a buck booster supplying a power source by changing the path between the first buck converter 411 and the second buck converter 412 are routed to other electrical components. According to certain embodiments of the disclosure, an example, in which an electronic device uses the first buck converter 411 and the second buck converter 412 independently, or uses the first buck converter 411 and the second buck converter 412 together as a buck booster, is not limited to the descriptions. The electronic device may be used in various functions or operations.

Figure 5:
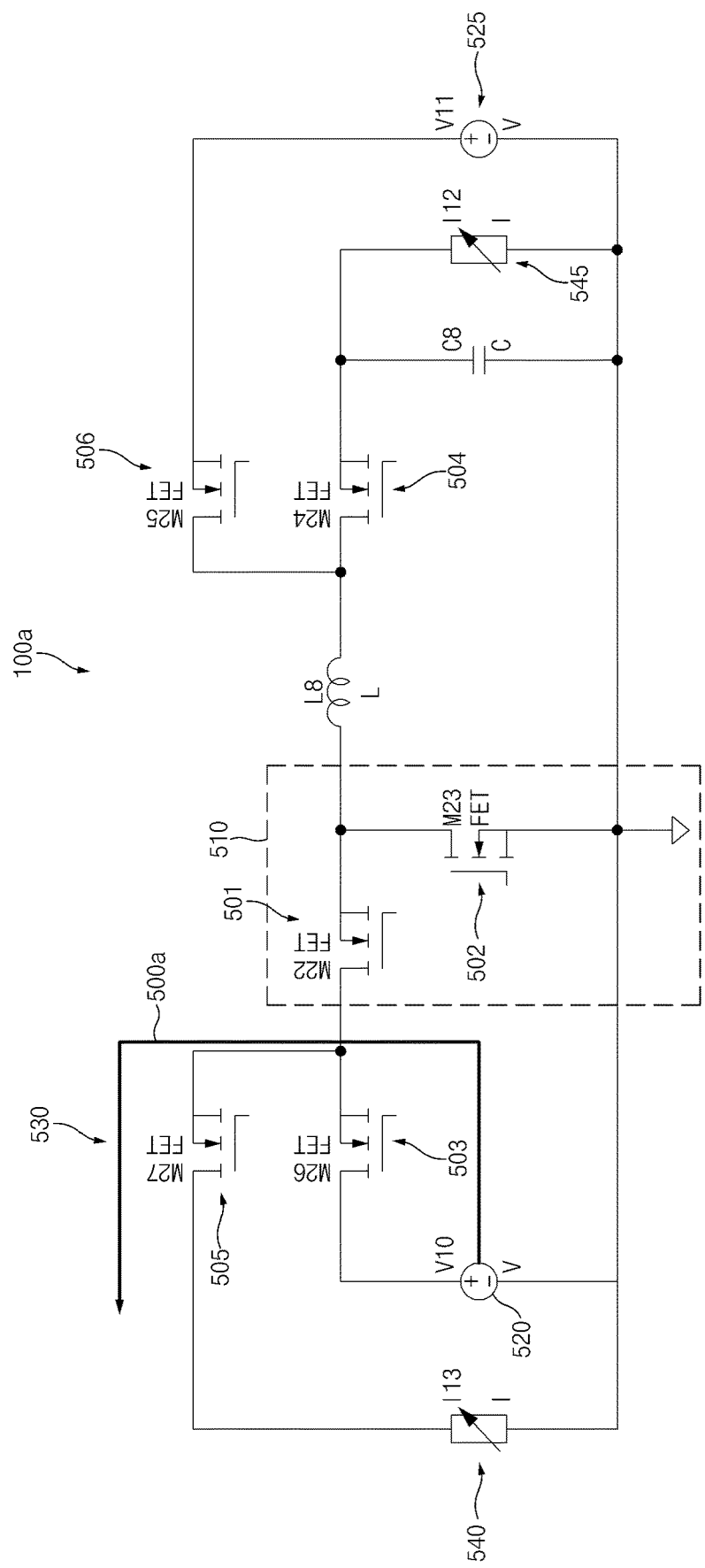
FIG. 5 illustrates a buck converter according to still another embodiment.

FIG. 5 illustrates a buck converter according to still another embodiment. FIG. 5 is an enlarged view of the area 100*a* in which the PMIC 160 (e.g., the power management module 688 of FIG. 6) is disposed, in the PCB 140 shown in FIG. 1. A buck converter 510 illustrated in FIG. 5 may be included in the PMIC 160 and may be different from the buck converters 10*a*, 10*b*, 161, 162, 411, and 412 illustrated in FIGS. 1 to 4.

Referring to FIG. 5, the PMIC 160 may include a buck converter x 510. According to an embodiment, the buck converter x 510 may include a first transistor 501 and a second transistor 502. According to an embodiment, an electrical component x 540 and/or electrical component y 545 may operate as a load. For example, the electrical component x 540 and/or electrical component y 545 may include an arbitrary element, part, or circuit.

According to an embodiment, the buck converter x 510 may be routed to one ends of a third transistor 503 and a fifth transistor 505. According to an embodiment, in the third transistor 503, one end may be routed to the buck converter x 510, and the other end may be routed to a power source x 520. One end of the fifth transistor 505 may be routed to the buck converter x 510; the other end of the fifth transistor 505 may be routed to the electrical component x 540. The other end of the buck converter x 510 may be routed to one end of an inductive element L8. The other end of the inductive element L8 may be routed to one end of a fourth transistor 504 and one end of a sixth transistor 506. The other end of the fourth transistor 504 may be routed to one ends of a capacitive element C8 and the electrical component y 545. The other end of the sixth transistor 506 may be routed to the one end of a power source y 525. According to an embodiment, the third to sixth transistors 503, 504, 505, and 506 may be operated as a switch.

According to an embodiment, the PMIC 160 may apply a proper voltage to the electrical component x 540 and/or the electrical component y 545, using the buck converter x 510 (e.g., the first and second transistors 501 and 502) and at least one transistor 503, 504, 505, or 506. For example, because the buck converter x 510 and the transistor 503 are routed on the PCB 140, an electrical path x 500a may be formed through a power source 520, the buck converter x 510, and at least one transistor 503, 504, 505, or 506. The PMIC 160 may apply a proper voltage to the electrical component x 540 through the electrical path x 500a, and the electrical component x 540 may operate.

According to an embodiment, the PMIC 160 may use the circuit of FIG. 5 as a buck converter, by shorting the third transistor 503 and the fourth transistor 504, and opening the fifth transistor 505 and the sixth transistor 506. For example, the PMIC 160 may apply a proper voltage to the electrical component y 545 through the buck converter 510. For example, the PMIC 160 may convert the voltage supplied from the power source 520 through the buck converter 510 and then may apply the converted voltage to the electrical component y 545.

According to an embodiment, the PMIC 160 may use the circuit of FIG. 5 as a buck booster, by opening the third transistor 503 and the fourth transistor 504, and shorting the fifth transistor 505 and the sixth transistor 506. For example, the PMIC 160 may convert (boost) the voltage supplied from the power source b 525 through a buck booster, and may apply the converted voltage to the electrical component x 540.

However, the PMIC 160 according to an embodiment of the disclosure may change a path through which the buck converter x 510 is routed to other electrical components. The changed path may allow the buck converter x 510 to operate as a booster. Accordingly, a space for mounting a booster may be unnecessary or reduced in the PMIC 160 according to an embodiment of the disclosure, and a production cost of the PMIC 160 may be reduced.

Accordingly to an embodiment, an electronic device comprises a battery disposed inside the electronic device; a printed circuit board (PCB) disposed inside the electronic device; at least one electronic component disposed on the PCB; and a first buck converter having a first end and a second end, wherein the first end is routed to the battery; and a second buck converter having a first end and a second end, wherein the first end is selectively electrically connected to the second end of the first buck converter, and the second end is routed to the at least one electronic component, and wherein the first buck converter and the second buck converter are configured to boost a voltage provided from the battery through an electrical path formed from the battery by the first end of the first buck converter, and the second end of the first buck converter, the first end of the second buck converter and the second end of the second buck converter to the at least one electronic component.

According to certain embodiments, the electronic device further comprises an inductive element interposed between the second end of the first buck converter and the first end of the second buck converter.

According to certain embodiments, the electronic device further comprises a third buck converter, having a first end selectively electrically connected to the battery and second end is selectively electrically connected to the at least one electronic component.

According to certain embodiments, the electronic device further comprises a PMIC, wherein the PMIC comprises the first buck converter, the second buck converter, and the third buck converter, and wherein the PMIC is configured to: reduce a voltage applied from the at least one electronic component through the third buck converter and charge the battery.

According to certain embodiments the first buck converter and the second buck converter are mounted on the PCB.

According to certain embodiments the at least one electronic component includes at least one of a USB port, a memory, a camera module, a proximity sensor, an illuminance sensor, a fingerprint sensor, and a communication processor.

According to certain embodiments the first buck converter comprises a first type of transistor and the second buck converter comprises a second type of transistor, wherein the first type and the second type are different.

According to certain embodiments the electronic device further comprises a PMIC, wherein the PMIC comprises the first buck converter, and the second buck converter, and wherein the PMIC is configured to: when the electronic device satisfies a specified condition, boost the voltage applied from the battery through the electrical path to apply the boosted voltage to the at least one electronic component.

According to certain embodiments an electronic device comprises: a battery disposed inside the electronic device; a PCB disposed inside the electronic device; at least one electronic component disposed on the PCB; and a PMIC routed to the battery and the at least one part, wherein the PMIC comprises: a first buck converter, having a first end and a second end, wherein the first end is routed to the battery and the second end is routed to a first switch; and a second buck converter, having a first end and a second end, wherein the first end is routed to the first switch and the second end is routed to the at least one electronic component, and wherein, when the electronic device satisfies a first condition, the PMIC is configured to short the first switch; and boost a voltage applied from the battery through an electrical path formed through the battery, the first buck converter, the first switch, and the second buck converter to apply the boosted voltage to the at least one electronic component.

According to certain embodiments the PMIC further comprises a second switch routed to the second end of the first buck converter; and a third switch routed to the first end of the second buck converter.

According to certain embodiments the at least one electronic component includes a first electronic component routed to the second switch; and a second electronic component routed to the third switch.

According to certain embodiments when the electronic device satisfies a second condition, the PMIC is configured to: open the first switch; short the second switch and the third switch; reduce a voltage applied from the battery through an electrical path formed through the battery, the first buck converter, and the second switch to apply the reduced voltage to the first electronic component; and reduce a voltage applied from the battery through an electrical path formed through the battery, the second buck converter, and the third switch to apply the reduced voltage to the second electronic component.

According to certain embodiments, the PMIC is configured to: when the electronic device satisfies the first condition, open the second switch and the third switch.

According to certain embodiments, the electronic device further comprises an inductive element disposed on a path through which the first switch and the second buck converter are routed.

According to certain embodiments, the first switch, the second switch, and the third switch are disposed on the PCB.

According to certain embodiments, the at least one electronic component includes at least one of a USB port, a memory, a camera module, a proximity sensor, an illuminance sensor, a fingerprint sensor, and a communication processor.

According to certain embodiments, the first buck converter includes a first type of transistor and the second buck converter includes a second type of transistor different from the first type of transistor.

Figure 6:
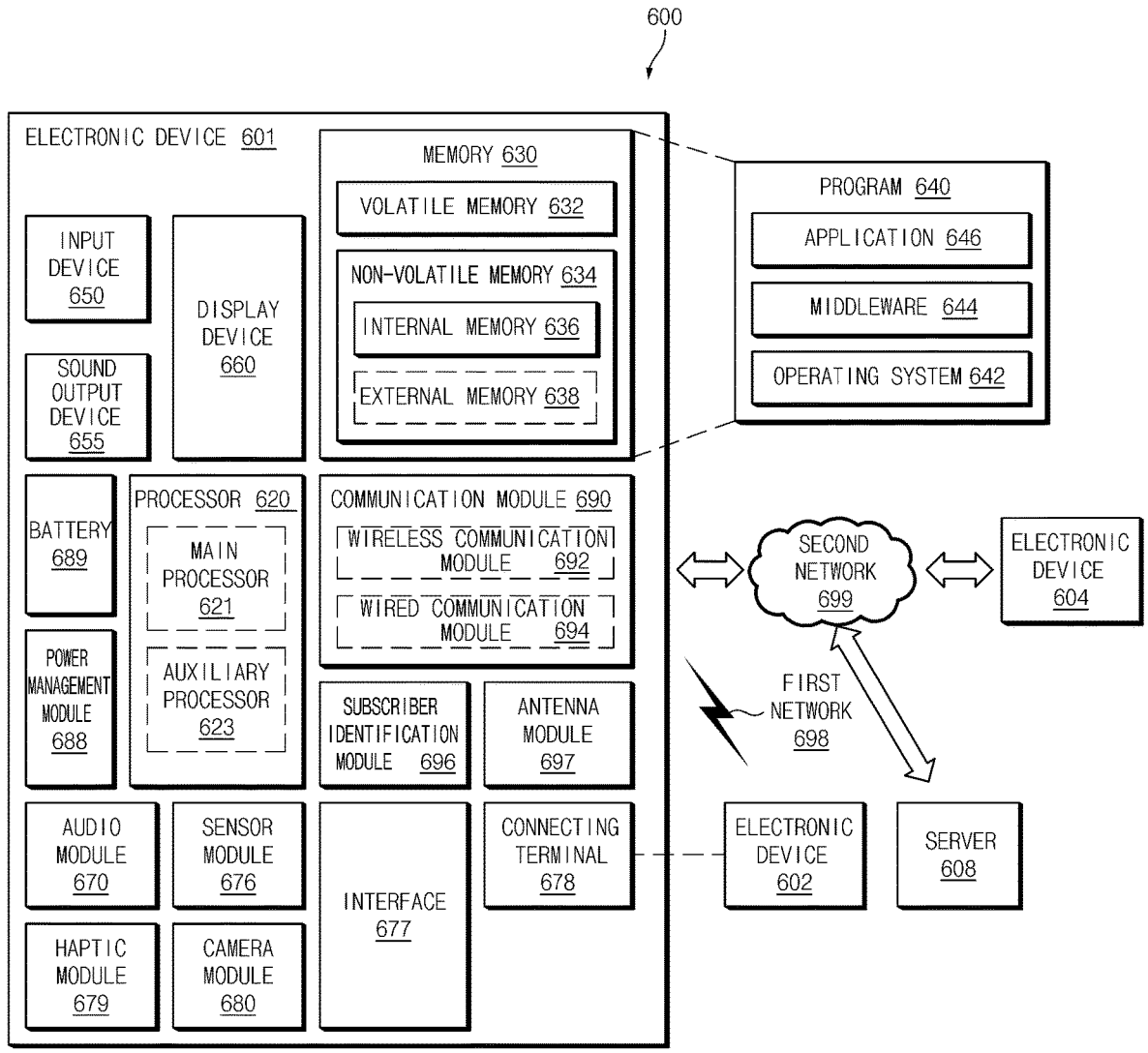
FIG. 6 is a block diagram illustrating an electronic device in a network environment according to certain embodiments.

FIG. 6 is a block diagram illustrating an electronic device 601 in a network environment 600 according to certain embodiments. Referring to FIG. 6, the electronic device 601 in the network environment 600 may communicate with an electronic device 602 via a first network 698 (e.g., a short-range wireless communication network), or an electronic device 604 or a server 608 via a second network 699 (e.g., a long-range wireless communication network). According to an embodiment, the electronic device 601 may communicate with the electronic device 604 via the server 608. According to an embodiment, the electronic device 601 may include a processor 620, memory 630, an input device 650, a sound output device 655, a display device 660, an audio module 670, a sensor module 676, an interface 677, a haptic module 679, a camera module 680, a power management module 688, a battery 689, a communication module 690, a subscriber identification module (SIM) 696, or an antenna module 697. In some embodiments, at least one (e.g., the display device 660 or the camera module 680) of the components may be omitted from the electronic device 601, or one or more other components may be added in the electronic device 601. In some embodiments, some of the components may be implemented as single integrated circuitry. For example, the sensor module 676 (e.g., a fingerprint sensor, an iris sensor, or an illuminance sensor) may be implemented as embedded in the display device 660 (e.g., a display).

The processor 620 may execute, for example, software (e.g., a program 640) to control at least one other component (e.g., a hardware or software component) of the electronic device 601 coupled with the processor 620, and may perform various data processing or computation. According to one embodiment, as at least part of the data processing or computation, the processor 620 may load a command or data received from another component (e.g., the sensor module 676 or the communication module 690) in volatile memory 632, process the command or the data stored in the volatile memory 632, and store resulting data in non-volatile memory 634. According to an embodiment, the processor 620 may include a main processor 621 (e.g., a central processing unit (CPU) or an application processor (AP)), and an auxiliary processor 623 (e.g., a graphics processing unit (GPU), an image signal processor (ISP), a sensor hub processor, or a communication processor (CP)) that is operable independently from, or in conjunction with, the main processor 621. Additionally or alternatively, the auxiliary processor 623 may be adapted to consume less power than the main processor 621, or to be specific to a specified function. The auxiliary processor 623 may be implemented as separate from, or as part of the main processor 621.

The auxiliary processor 623 may control at least some of functions or states related to at least one component (e.g., the display device 660, the sensor module 676, or the communication module 690) among the components of the electronic device 601, instead of the main processor 621 while the main processor 621 is in an inactive (e.g., sleep) state, or together with the main processor 621 while the main processor 621 is in an active state (e.g., executing an application). According to an embodiment, the auxiliary processor 623 (e.g., an image signal processor or a communication processor) may be implemented as part of another component (e.g., the camera module 680 or the communication module 690) functionally related to the auxiliary processor 623.

The memory 630 may store various data used by at least one component (e.g., the processor 620 or the sensor module 676) of the electronic device 601. The various data may include, for example, software (e.g., the program 640) and input data or output data for a command related thererto. The memory 630 may include the volatile memory 632 or the non-volatile memory 634.

The program 640 may be stored in the memory 630 as software, and may include, for example, an operating system (OS) 642, middleware 644, or an application 646.

The input device 650 may receive a command or data to be used by other component (e.g., the processor 620) of the electronic device 601, from the outside (e.g., a user) of the electronic device 601. The input device 650 may include, for example, a microphone, a mouse, a keyboard, or a digital pen (e.g., a stylus pen).

The sound output device 655 may output sound signals to the outside of the electronic device 601. The sound output device 655 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 660 may visually provide information to the outside (e.g., a user) of the electronic device 601. The display device 660 may include, for example, a display, a hologram device, or a projector and control circuitry to control a corresponding one of the display, hologram device, and projector. According to an embodiment, the display device 660 may include touch circuitry adapted to detect a touch, or sensor circuitry (e.g., a pressure sensor) adapted to measure the intensity of force incurred by the touch.

The audio module 670 may convert a sound into an electrical signal and vice versa. According to an embodiment, the audio module 670 may obtain the sound via the input device 650, or output the sound via the sound output device 655 or a headphone of an external electronic device (e.g., an electronic device 602) directly (e.g., wiredly) or wirelessly coupled with the electronic device 601.

The sensor module 676 may detect an operational state (e.g., power or temperature) of the electronic device 601 or an environmental state (e.g., a state of a user) external to the electronic device 601, and then generate an electrical signal or data value corresponding to the detected state. According to an embodiment, the sensor module 676 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 677 may support one or more specified protocols to be used for the electronic device 601 to be coupled with the external electronic device (e.g., the electronic device 602) directly (e.g., wiredly) or wirelessly. According to an embodiment, the interface 677 may include, for example, a high definition multimedia interface (HDMI), a universal serial bus (USB) interface, a secure digital (SD) card interface, or an audio interface.

A connecting terminal 678 may include a connector via which the electronic device 601 may be physically connected with the external electronic device (e.g., the electronic device 602). According to an embodiment, the connecting terminal 678 may include, for example, a HDMI connector, a USB connector, a SD card connector, or an audio connector (e.g., a headphone connector).

The haptic module 679 may convert an electrical signal into a mechanical stimulus (e.g., a vibration or a movement) or electrical stimulus which may be recognized by a user via his tactile sensation or kinesthetic sensation. According to an embodiment, the haptic module 679 may include, for example, a motor, a piezoelectric element, or an electric stimulator.

The camera module 680 may capture a still image or moving images. According to an embodiment, the camera module 680 may include one or more lenses, image sensors, image signal processors, or flashes.

The power management module 688 may manage power supplied to the electronic device 601. According to one embodiment, the power management module 688 may be implemented as at least part of, for example, a power management integrated circuit (PMIC).

The battery 689 may supply power to at least one component of the electronic device 601. According to an embodiment, the battery 689 may include, for example, a primary cell which is not rechargeable, a secondary cell which is rechargeable, or a fuel cell.

The communication module 690 may support establishing a direct (e.g., wired) communication channel or a wireless communication channel between the electronic device 601 and the external electronic device (e.g., the electronic device 602, the electronic device 604, or the server 608) and performing communication via the established communication channel. The communication module 690 may include one or more communication processors that are operable independently from the processor 620 (e.g., the application processor (AP)) and supports a direct (e.g., wired) communication or a wireless communication. According to an embodiment, the communication module 690 may include a wireless communication module 692 (e.g., a cellular communication module, a short-range wireless communication module, or a global navigation satellite system (GNSS) communication module) or a wired communication module 694 (e.g., a local area network (LAN) communication module or a power line communication (PLC) module). A corresponding one of these communication modules may communicate with the external electronic device via the first network 698 (e.g., a short-range communication network, such as Bluetooth™, wireless-fidelity (Wi-Fi) direct, or infrared data association (IrDA)) or the second network 699 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 692 may identify and authenticate the electronic device 601 in a communication network, such as the first network 698 or the second network 699, using subscriber information (e.g., international mobile subscriber identity (IMSI)) stored in the subscriber identification module 696.

The antenna module 697 may transmit or receive a signal or power to or from the outside (e.g., the external electronic device) of the electronic device 601. According to an embodiment, the antenna module 697 may include an antenna including a radiating element composed of a conductive material or a conductive pattern formed in or on a substrate (e.g., PCB). According to an embodiment, the antenna module 697 may include a plurality of antennas. In such a case, at least one antenna appropriate for a communication scheme used in the communication network, such as the first network 698 or the second network 699, may be selected, for example, by the communication module 690 (e.g., the wireless communication module 692) from the plurality of antennas. The signal or the power may then be transmitted or received between the communication module 690 and the external electronic device via the selected at least one antenna. According to an embodiment, another component (e.g., a radio frequency integrated circuit (RFIC)) other than the radiating element may be additionally formed as part of the antenna module 697.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 601 and the external electronic device 604 via the server 608 coupled with the second network 699. Each of the electronic devices 602 and 604 may be a device of a same type as, or a different type, from the electronic device 601. According to an embodiment, all or some of operations to be executed at the electronic device 601 may be executed at one or more of the external electronic devices 602, 604, or 608. For example, if the electronic device 601 should perform a function or a service automatically, or in response to a request from a user or another device, the electronic device 601, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 601. The electronic device 601 may provide the outcome, with or without further processing of the outcome, as at least part of a reply to the request. To that end, a cloud computing, distributed computing, or client-server computing technology may be used, for example.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 640) including one or more instructions that are stored in a storage medium (e.g., internal memory 636 or external memory 638) that is readable by a machine (e.g., the electronic device 601). For example, a processor (e.g., the processor 620) of the machine (e.g., the electronic device 601) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory storage medium" means a tangible device, and does not include a signal (e.g., an electromagnetic wave), but this term does not differentiate between where data is semi-permanently stored in the storage medium and where the data is temporarily stored in the storage medium. For example, "the non-transitory storage medium" may include a buffer where data is temporally stored.

According to an embodiment, a method according to certain embodiments of the disclosure may be included and provided in a computer program product. The computer program product may be traded as a product between a seller and a buyer. The computer program product (e.g., downloadable app)) may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

According to the embodiments disclosed in this specification, it is possible to increase the mounting area of a PMIC. Furthermore, according to the embodiments disclosed in this specification, it is possible to reduce the production cost of the PMIC.

Besides, a variety of effects directly or indirectly understood through the disclosure may be provided.

While the disclosure has been shown and described with reference to certain embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a battery disposed inside the electronic device;
   a printed circuit board (PCB) disposed inside the electronic device;
   at least one electronic component disposed on the PCB;
   a first buck converter configured to output a first level of voltage that is reduced from a voltage level of the battery, the first buck converter having a first end and a second end, wherein the first end is routed to the battery; and
   a second buck converter configured to output a second level of voltage that is reduced from the voltage level of the battery, the second buck converter having a first end and a second end, wherein the first end is configured to selectively connect electrically to the second end of the first buck converter, and the second end is routed to the at least one electronic component, and
   when the first end of the second buck converter electrically connects to the second end of the first buck converter, the first buck converter and the second buck converter form a buck booster configured to provide a boosted voltage level from the voltage level of the battery to the at least one electronic component.

2. The electronic device of claim 1, further comprising:
   an inductive element interposed between the second end of the first buck converter and the first end of the second buck converter.

3. The electronic device of claim 1, further comprising:
   a third buck converter, having a first end selectively electrically connected to the battery and a second end selectively electrically connected to the at least one electronic component.

4. The electronic device of claim 3, wherein the electronic device further comprises a PMIC, wherein the PMIC comprises the first buck converter, the second buck converter, and the third buck converter, and wherein the PMIC is configured to:
reduce a voltage applied from the at least one electronic component through the third buck converter and charge the battery.

5. The electronic device of claim 1, wherein the first buck converter and the second buck converter are mounted on the PCB.

6. The electronic device of claim 1, wherein the at least one electronic component includes at least one of a USB port, a memory, a camera module, a proximity sensor, an illuminance sensor, a fingerprint sensor, and a communication processor.

7. The electronic device of claim 1, wherein the first buck converter comprises a first type of transistor and the second buck converter comprises a second type of transistor, wherein the first type and the second type are different.

8. The electronic device of claim 1, wherein the electronic device further comprises a PMIC, wherein the PMIC comprises the first buck converter, and the second buck converter, and wherein the PMIC is configured to:
when the electronic device satisfies a specified condition, boost the voltage applied from the battery through an electrical path to apply the boosted voltage to the at least one electronic component.

9. An electronic device comprising:
a battery disposed inside the electronic device;
a PCB disposed inside the electronic device;
at least one electronic component disposed on the PCB; and
an PMIC routed to the battery and the at least one electronic component,
wherein the PMIC comprises:
a first buck converter, having a first end and a second end, wherein the first end is routed to the battery and the second end is routed to a first switch; and
a second buck converter, having a first end and a second end, wherein the first end is routed to the first switch and the second end is routed to the at least one electronic component, and
wherein, when the electronic device satisfies a first condition, the PMIC is configured to:
short the first switch; and
boost a voltage applied from the battery through an electrical path formed through the battery, the first buck converter, the first switch, and the second buck converter to apply the boosted voltage to the at least one electronic component.

10. The electronic device of claim 9, wherein the PMIC further comprises:
a second switch routed to the second end of the first buck converter; and
a third switch routed to the first end of the second buck converter.

11. The electronic device of claim 10, wherein the at least one electronic component includes:
a first electronic component routed to the second switch; and
a second electronic component routed to the third switch.

12. The electronic device of claim 11, wherein when the electronic device satisfies a second condition, the PMIC is configured to:
open the first switch;
short the second switch and the third switch;
reduce a voltage applied from the battery through an electrical path formed through the battery, the first buck converter, and the second switch to apply the reduced voltage to the first electronic component; and
reduce a voltage applied from the battery through an electrical path formed through the battery, the second buck converter, and the third switch to apply the reduced voltage to the second electronic component.

13. The electronic device of claim 10, wherein the PMIC is configured to:
when the electronic device satisfies the first condition, open the second switch and the third switch.

14. The electronic device of claim 9, further comprising:
an inductive element disposed on a path through which the first switch and the second buck converter are routed.

15. The electronic device of claim 10, wherein the first switch, the second switch, and the third switch are disposed on the PCB.

16. The electronic device of claim 9, wherein the at least one electronic component includes at least one of a USB port, a memory, a camera module, a proximity sensor, an illuminance sensor, a fingerprint sensor, and a communication processor.

17. The electronic device of claim 9, wherein the first buck converter includes a first type of transistor and the second buck converter includes a second type of transistor different from the first type of transistor.

* * * * *